US008941443B1

(12) United States Patent
Newgard

(10) Patent No.: US 8,941,443 B1
(45) Date of Patent: Jan. 27, 2015

(54) ELECTRONICALLY TUNED CAVITY FILTER

(75) Inventor: Robert Newgard, Central City, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 385 days.

(21) Appl. No.: 13/409,718

(22) Filed: Mar. 1, 2012

(51) Int. Cl.
H03K 3/282 (2006.01)

(52) U.S. Cl.
USPC ....... 331/117 R; 333/202; 333/204; 333/207; 333/208

(58) Field of Classification Search
USPC ....... 333/202, 204, 207, 208; 331/117 R, 167
See application file for complete search history.

(56) References Cited

U.S. PATENT DOCUMENTS

| 4,459,571 | A | * | 7/1984 | Fraser | 333/202 |
| 5,045,825 | A | * | 9/1991 | McJunkin | 333/222 |
| 6,133,810 | A | * | 10/2000 | Shockley | 333/207 |
| 2001/0015681 | A1 | * | 8/2001 | Hino | 331/117 R |
| 2004/0085103 | A1 | * | 5/2004 | Ahn et al. | 327/156 |
| 2005/0225411 | A1 | * | 10/2005 | Sauder et al. | 333/202 |
| 2007/0241843 | A1 | * | 10/2007 | D'Ostilio | 333/229 |
| 2008/0309435 | A1 | * | 12/2008 | Wu | 333/204 |
| 2009/0128263 | A1 | * | 5/2009 | Hesselbarth | 333/230 |
| 2010/0073208 | A1 | * | 3/2010 | Karthaus et al. | 341/120 |
| 2011/0241802 | A1 | * | 10/2011 | Joshi et al. | 333/209 |

* cited by examiner

Primary Examiner — Joseph Chang
Assistant Examiner — Jeffrey Shin
(74) Attorney, Agent, or Firm — Angel N. Gerdzhikov; Donna P. Suchy; Daniel M. Barbieri

(57) ABSTRACT

A cavity filter having a piezoelectric tuning element is tuned by determining a desired oscillating frequency for the piezoelectric tuning element and applying that frequency through a phase-locked loop. The phase-locked loop maintains the piezoelectric tuning element at the desired frequency.

18 Claims, 5 Drawing Sheets

ELECTRONICALLY TUNED CAVITY FILTER

GOVERNMENT LICENSE RIGHT

The U.S. Government has a paid-up license in this invention and the right in limited circumstances to require the patent owner to license others on reasonable terms as provided by the terms of N00173-06-C-2055 awarded by the Defense Advanced Research Projects Agency.

FIELD OF THE INVENTION

The present invention is directed generally toward software defined radios, and more particularly to dynamically tunable cavity filters.

BACKGROUND OF THE INVENTION

Radio frequency (RF) and microwave filters represent a class of electronic filter, designed to operate on signals in the megahertz to gigahertz frequency ranges. This frequency range is the range used by most broadcast radio, television, wireless communication (cellphones, Wi-Fi, etc.), and thus most RF and microwave devices will include some kind of filtering on the signals transmitted or received. Such filters are commonly used as building blocks for duplexers and diplexers to combine or separate multiple frequency bands.

Cavity filters are the basic circuitry behind a Duplexer. Cavity filters are sharply tuned resonant circuits that allow only certain frequencies to pass. Physically a cavity filter is a resonator inside a conducting "box" with coupling loops at the input and output. Cavity filters are widely used in the 40 MHz to 960 MHz frequency range; well constructed cavity filters are capable of high selectivity even under power loads of at least a megawatt. Higher Q quality factor, as well as increased performance stability at closely spaced (down to 75 kHz) frequencies, can be achieved by increasing the internal volume of the filter cavities. In the microwave range (1000 MHz (or 1 GHz) and higher), cavity filters become more practical in terms of size and a significantly higher quality factor than lumped element, micro-strip, or strip-line resonators and filters.

Cavity filters are fixed filters that lack significant center frequency tuning. In order to accommodate software defined radios large banks of filters may be required because a software defined radio may need to operate under many different sets of parameters.

Some filters are designed with varactors as variable capacitors. Such filters may only handle low power loads and may have poor performance characteristics otherwise.

Consequently, it would be advantageous if an apparatus existed that is suitable for electronically tuning the center frequency of a cavity filter.

SUMMARY OF THE INVENTION

Accordingly, the present invention is directed to a novel method and apparatus for electronically tuning the center frequency of a cavity filter.

One embodiment of the present invention is a cavity filter with a phase-locked loop (PLL) tuner to electronically control the center frequency of the cavity filter.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
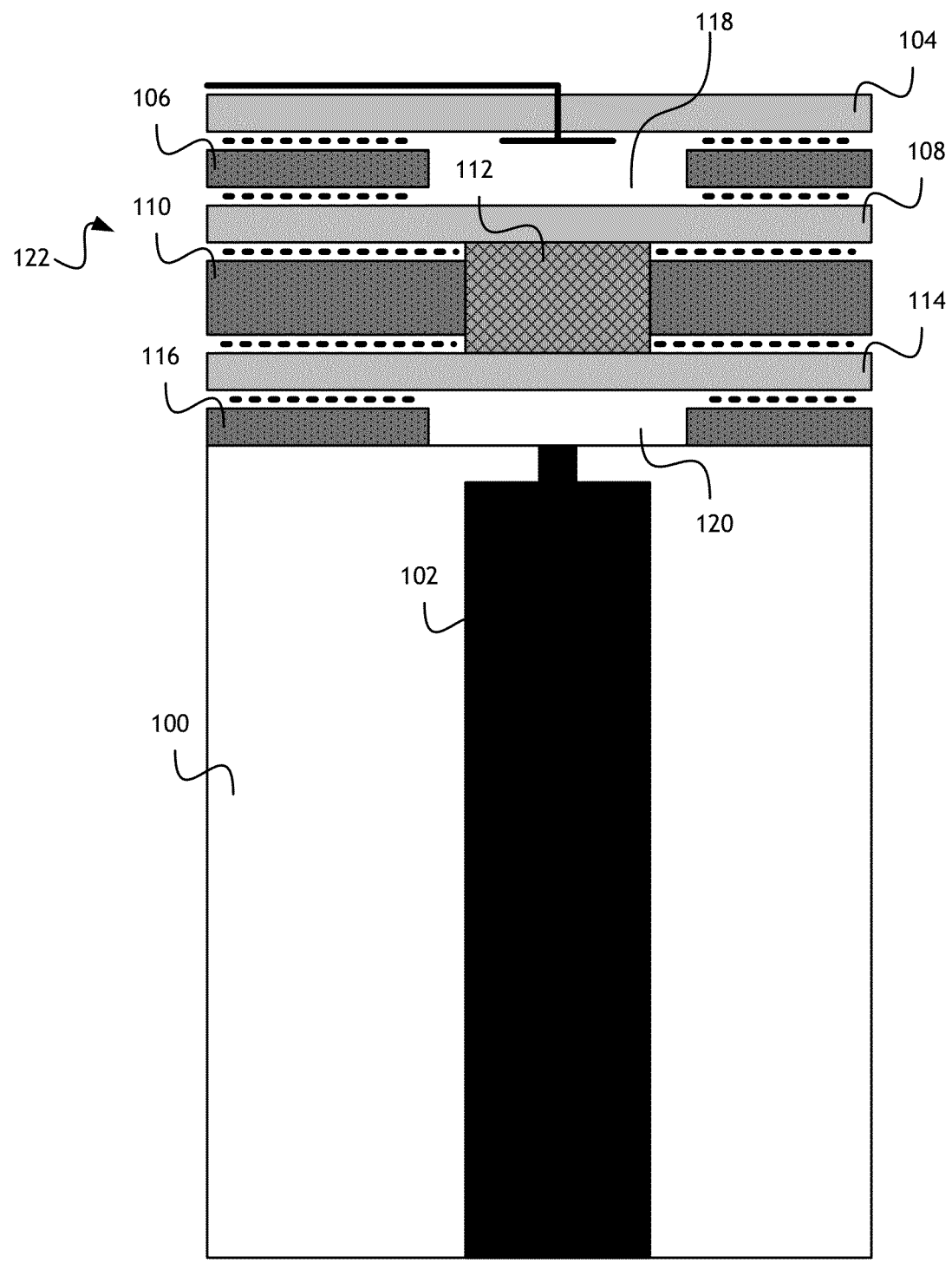
FIG. 1 shows a block diagram of a cavity filter having a piezoelectric tuning element.

Referring to FIG. 1, a cavity filter according to one embodiment of the present invention is shown. The cavity filter may comprise a cavity 100, a resonator 102 and a membrane assembly 122. The membrane assembly 122 may comprise a cavity-membrane spacer 116 separating the cavity 100 from a lower flexible-laminate film 114. The lower flexible-laminate film 114 may comprise laminate constructed of polyimide film laminated to copper foil on both sides. The lower flexible laminate film 114 and cavity-membrane spacer 116 may form a cavity air gap 120 between the cavity 100 and the lower flexible-laminate film 114. The cavity air gap 120 may comprise a portion of the cavity 100, and therefore the size of the cavity air gap 120 may directly alter the operational frequency range of the cavity filter. The membrane assembly 122 may also comprise a backer board 110. The lower flexible-laminate film 114 may be bonded to the backer board 110. The backer board 110 may house a piezoelectric tuning element 112. The piezoelectric tuning element 112 may comprise a lead zirconate titanate (PZT) piezoelectric disk, or other material exhibiting appropriate piezoelectric effect. The membrane assembly 122 may also comprise an upper flexible-laminate film 108. The backer board 110 and piezoelectric tuning element 112 may be bonded to the upper flexible-laminate film 108. The upper flexible-laminate film 108 may comprise polyimide film. The membrane assembly 122 may also comprise a Phase-locked loop (PLL) circuit card 104 and a PLL circuit card-oscillator spacer 106 separating the PLL circuit card 104 from the upper flexible-laminate film 108. The upper flexible-laminate film 108 and PLL circuit card-oscillator spacer 106 may form a PLL air gap 118 between the PLL circuit card 104 and the upper flexible-laminate film 108. The PLL circuit card 104 may comprise a PLL circuit.

A PLL is a control system that generates an output signal that's phase is related to the phase of an input reference signal. A PLL is an electronic circuit consisting of a variable frequency oscillator, frequency divider, loop filter and a phase detector. The circuit compares the phase of the input reference signal with the phase of the signal derived from the voltage controlled oscillator (VCO) and adjusts the frequency of the VCO to keep the phases locked. The signal from the phase detector is used to control the VCO. Frequency is a derivative of phase; therefore, by keeping the input and output phases matched, the input and output frequencies are also matched. Consequently, a PLL can track an input reference frequency generating a VCO frequency that is a multiple of the input frequency.

The PLL air gap 118, bounded by the PLL circuit card 104 and the flexible-laminate film 108, may comprise a VCO resonator capacitor. Because the flexible-laminate film 108 is bonded to the piezoelectric tuning element 112, voltage changes to the VCO may induce a piezoelectric effect in the piezoelectric tuning element 112 and thereby cause some displacement of the piezoelectric tuning element 112. A displacement of the piezoelectric tuning element 112 may alter the size of cavity air gap 120 and thereby alter the operational frequency range of the cavity filter. The VCO may therefore be used to tune the cavity filter. The PLL air gap 118 establishes the center frequency of the VCO. The PLL circuit card 104 may produce a control voltage to induce a piezoelectric effect in the piezoelectric tuning element 112.

Piezoelectric elements may exhibit hysteresis or mechanical creep when tuning, which may cause fluctuations in the center frequency of the VCO. The PLL circuit card 104 may maintain the PLL air gap 118, and therefore maintain the position and center frequency of the VCO. Also, a tuning membrane may be sensitive to vibrations. The PLL circuit card 104 in the membrane assembly 122 may suppress vibration sensitivity; for example, the PLL circuit card 104 may suppress movement of the piezoelectric tuning element 112 due to gravity or acceleration.

Figure 2:
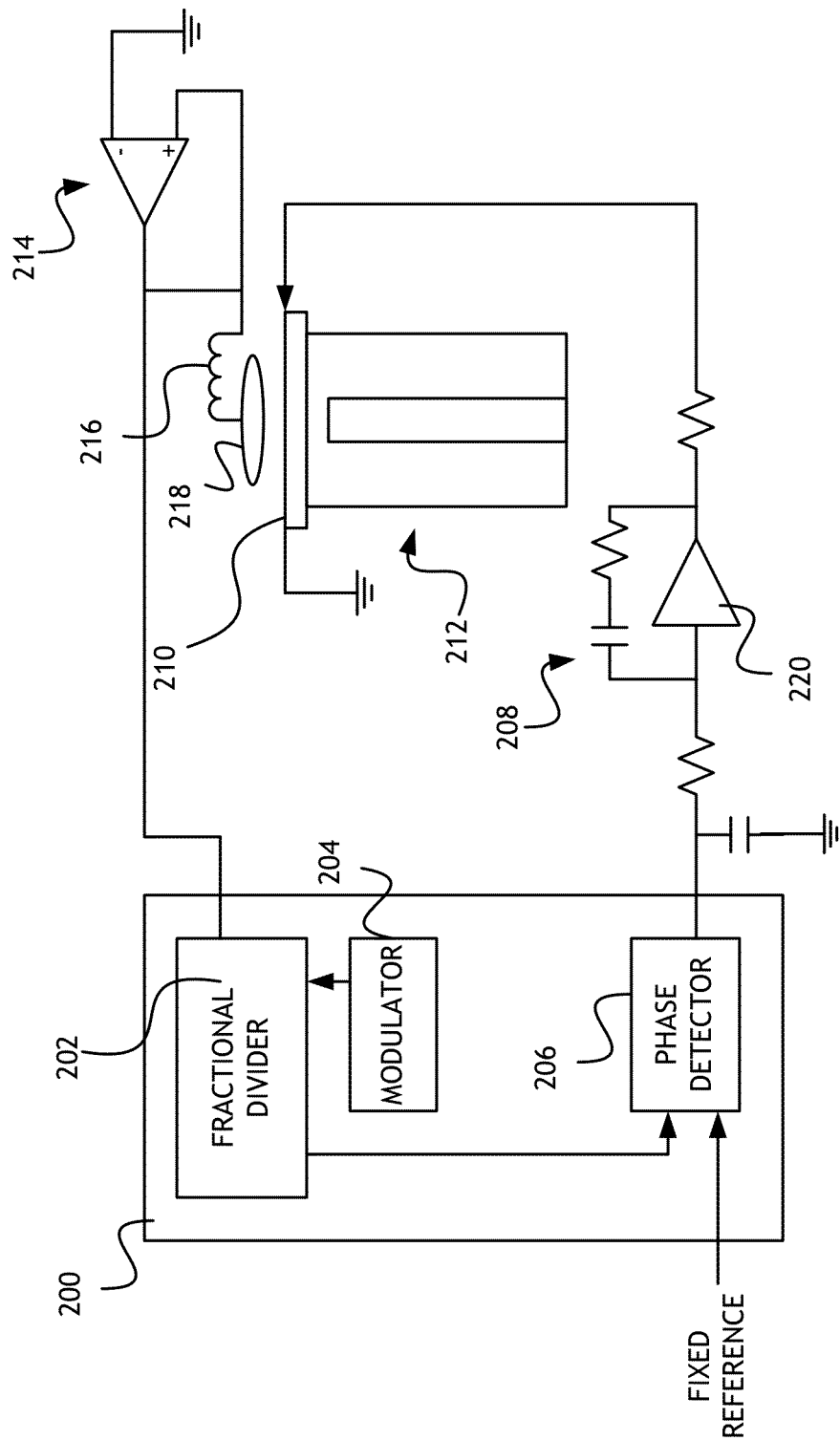
FIG. 2 shows a block diagram of a circuit for controlling a cavity filter with a piezoelectric tuning element.

Referring to FIG. 2, a PLL control system connected to a cavity filter as in one embodiment of the present invention is shown. The PLL control system may comprise a processing unit 200 having a fractional frequency divider 202. The fractional frequency divider 202 may receive input from a modulator 204. The processing unit 200 may also comprise a phase detector 206. The phase detector 206 may receive input from the fractional divider 202 and may also receive a fixed reference frequency. The processing unit 200 may be a fractional-N frequency synthesizer. The PLL control system may also comprise a PLL loop filter 208. The PLL loop filter may include a high voltage operational amplifier (op-amp) 220. The output of the PLL loop filter 208 may be a voltage configured to control a piezoelectric tuning element 210 in a cavity filter 212. In at least one embodiment, the voltage may be within a range of −200V to +200V.

A capacitive disk 218 and tank coil 216 in proximity to the piezoelectric tuning element 210 may work to manipulate the PLL air gap 118 as a function of the voltage at the piezoelectric tuning element 210. The capacitive disk 218, tank coil 216 and piezoelectric tuning element 210 may comprise the elements of a VCO, implemented as an LC oscillator. One skilled in the art will appreciate that the voltage at the piezoelectric tuning element 210 may control the output frequency of a VCO gain element 214. In at least one embodiment, the output frequency of oscillation (FOSC) of the VCO gain element 214 may be within a range of 1 GHz to 1.5 GHz. The output FOSC of the VCO gain element 214 may be received by the fractional divider 202 in the processing unit 200. The fractional divider 202 may alter the signal sent to the phase detector 206 based on the output FOSC of the VCO gain element 214. Altering the signal sent to the phase detector 206 may cause the PLL loop filter 208 to produce a voltage configured to control the piezoelectric tuning element 210 such that the LC oscillator frequency may lock to the desired LC oscillator frequency required to tune the cavity filter 212.

The VCO gain element 214, fractional frequency divider 202, phase detector 206 and PLL loop filter 208 thereby produce a feedback loop to alter the voltage applied to the piezoelectric tuning element 210. The VCO gain element 214, fractional frequency divider 202, phase detector 206 and PLL loop filter 208 may continue to alter the voltage until a desired LC oscillator frequency, and thus a desired center frequency for the cavity filter 212, is achieved.

Figure 3:
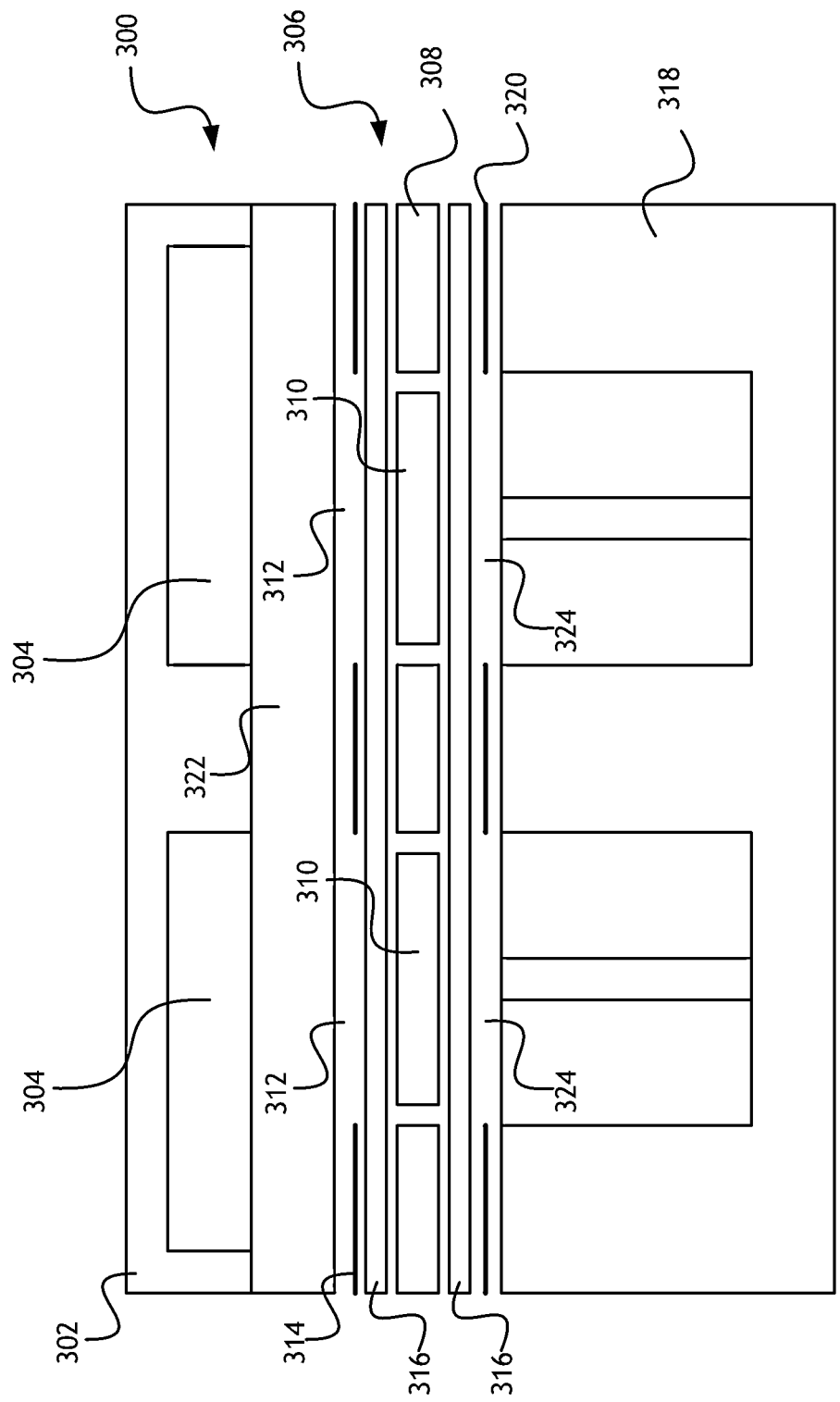
FIG. 3 shows a block diagram of a two-pole cavity filter having piezoelectric tuning elements.

Referring to FIG. 3, a multi-cavity filter having two separate cavity resonators according to another embodiment of the present invention is shown. The multi-cavity filter may comprise a cavity filter housing 318 defining each cavity resonator, substantially similar to the cavity resonator shown in FIG. 1, a multi-resonator membrane assembly 306 and a multi-filter control assembly 300. The multi-filter membrane assembly 306 may comprise a lower flexible-laminate film 316, separated from the cavity filter housing 318 by one or more housing spacers 320. The one or more housing spacers 320 may comprise copper shims. The lower flexible-laminate film 114 may comprise laminate constructed of polyimide film laminated to copper foil on both sides. The cavity filter housing 318 and lower flexible-laminate film 316 may define one or more cavity air gaps 324. Each cavity air gap 324 may comprise a portion of one cavity resonator such that a change in the size of the cavity air gap 324 may alter the operational frequency of the cavity resonator. The multi-filter membrane assembly 306 may also comprise one or more piezoelectric element spacers 308. The lower flexible-laminate film 316 may be bonded to the one or more piezoelectric element spacers 308. The one or more piezoelectric element spacers 308 may house a plurality of piezoelectric tuning elements 310. Each piezoelectric tuning element 310 may comprise a PZT piezoelectric disk, or other material exhibiting appropriate piezoelectric effect. Each piezoelectric tuning element 310 may be associated with one cavity resonator in the cavity filter housing 318. The multi-resonator membrane assembly 306 may also comprise an upper flexible-laminate film 316. The one or more piezoelectric element spacers 308 and piezoelectric tuning elements 310 may be bonded to the upper flexible-laminate film 316. The upper flexible-laminate film 316 may comprise laminate constructed of polyimide film laminated to copper foil on both sides. The multi-resonator membrane assembly 306 may be separated from the multi-resonator control assembly 300 by one or more control spacers 314. The one or more control spacers 314 may comprise copper shims.

The multi-resonator control assembly 300 may comprise a PLL circuit card 322, a plurality of PLL oscillator circuits 304, each PLL oscillator circuit 304 associated with one piezoelectric tuning element 310, and a cover 302. Each PLL oscillator circuit 304 functions substantially as described herein to produce a feedback loop configured to achieve a desired VCO oscillation frequency (LC oscillation frequency where the VCO comprises an LC oscillator as described herein) through a displacement of each piezoelectric tuning element 310. The displacement of each piezoelectric tuning element 310 may further alter an associated cavity air gap 324, and therefore alter the characteristics of the associated cavity resonator. Each of the plurality of PLL oscillator circuits 304 may function independently from every other PLL oscillator circuit 304.

Figure 4:
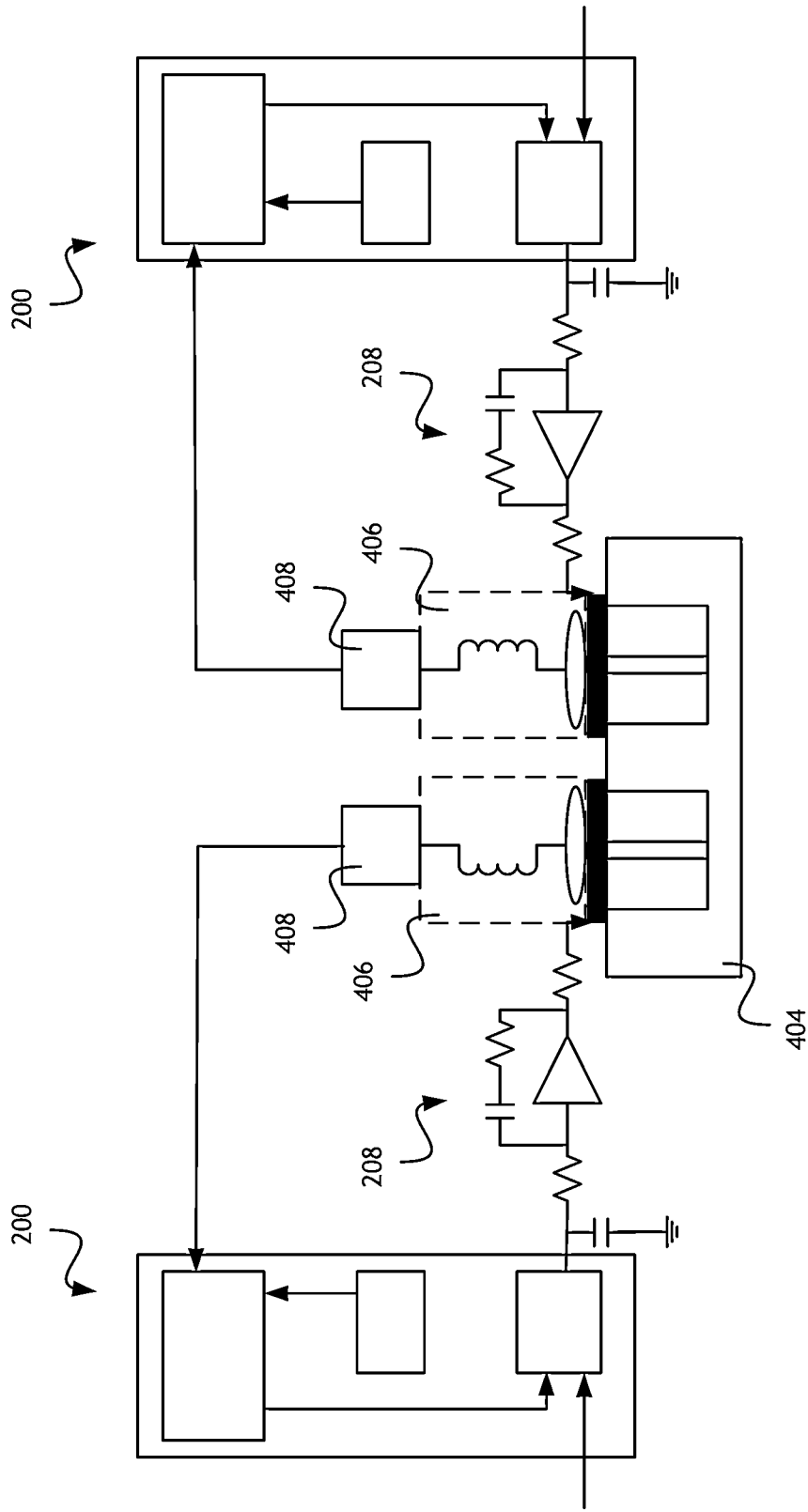
FIG. 4 shows a block diagram of a circuit for controlling a two-pole cavity filter with piezoelectric tuning elements.

Referring to FIG. 4, two PLL control systems connected to a two cavity filter assembly 404 is shown, wherein each PLL control system may be associated with one cavity resonator in the cavity filter assembly 404. Each PLL control system may comprise a processing unit 200 substantially as described in reference to FIG. 2. Each processing unit 200 may be a fractional-N frequency synthesizer. Each PLL control system may also comprise a PLL loop filter 208 substantially as described in reference to FIG. 2. The output of the PLL loop filter 208 may be a voltage configured to control a piezoelectric tuning element in a cavity filter in the cavity filter assembly 404.

A capacitive disk and tank coil in proximity to the piezoelectric tuning element may comprise a LC resonator 406 to generate a signal as a function of the voltage at the piezoelectric tuning element. A VCO gain element 408 in combination with LC resonator 406 may for a oscillator by positive feedback. One skilled in the art will appreciate that the voltage at the piezoelectric element 410 may control the output frequency of the VCO gain element 408. The output FOSC of the VCO gain element 408 may be received by the processing unit 200, which may alter the signal sent to the PLL loop filter 208. The PLL loop filter 208 may then produce a voltage configured to control the piezoelectric tuning element such that the LC oscillator frequency more closely matches the desired LC oscillator frequency to tune the cavity resonator in the cavity filter assembly 404.

The PLL control system 200, PLL loop filter 208, LC resonator 406 and VCO gain element 408 thereby produce a feedback loop to alter the voltage applied to the piezoelectric tuning element. The PLL control system 200, PLL loop filter 208, LC resonator 406 and VCO gain element 408 may continue to alter the voltage until a desired LC oscillator frequency, and thus a desired center frequency for each cavity resonator in the cavity filter assembly 404, is achieved.

Each PLL control system 200, PLL loop filter 208, LC resonator 406 and VCO gain element 408 may be elements of a PLL oscillator circuit as described in FIG. 3. Each PLL oscillator circuit may operate independently to produce an independent center frequency for each cavity resonator in the cavity filter assembly 404.

Figure 5:
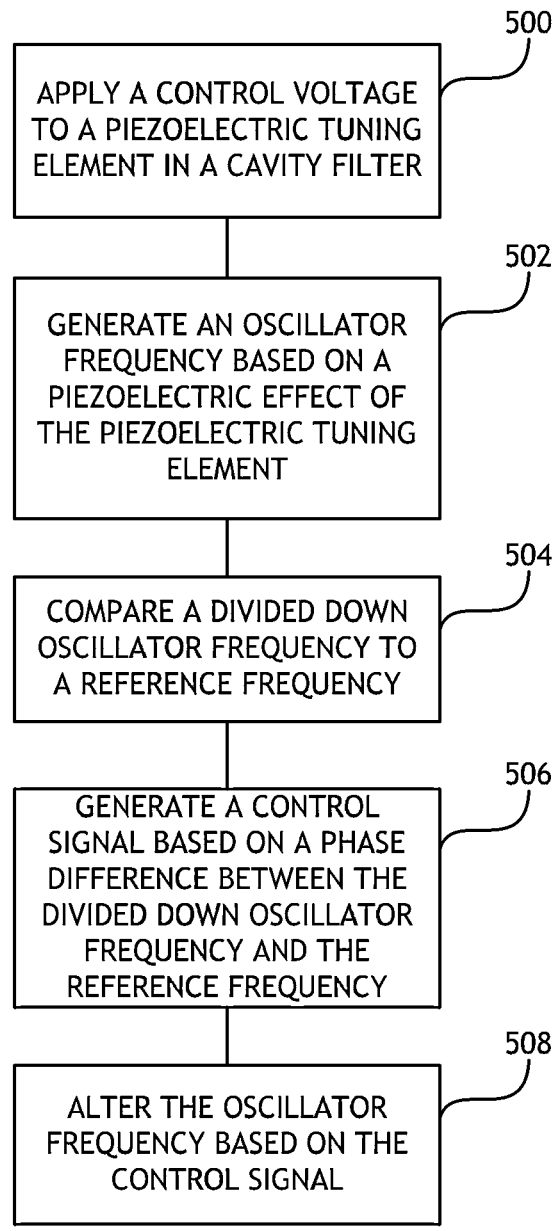
FIG. 5 shows a flowchart of a method for tuning a cavity filter having piezoelectric tuning elements with a phase-locked loop.

Referring to FIG. 5, a flowchart for tuning a cavity filter is shown. A PLL tuning system may tune a cavity filter having a piezoelectric tuning element by applying 500 a control voltage to the piezoelectric tuning element. The control voltage may be an initial voltage generated by a phase detector, through a PLL loop filter, based on a frequency generated by a LC oscillator and a reference frequency. The frequency generated by the LC oscillator may be a frequency configured to produce an air gap between a capacitive disk and the piezoelectric tuning element, and a corresponding cavity air gap between the piezoelectric tuning element and a resonator. A specific cavity air gap may produce a desired center frequency in the cavity filter, but the exact frequency to produce the desired cavity air gap may not be known in advance, or the desired center frequency may change as the specific application of the cavity filter changes over time.

The PLL tuning system may then generate 502 an oscillator frequency. The oscillator frequency may be based on the displacement of the piezoelectric tuning element do to a piezoelectric effect. The oscillator frequency may be generated by a VCO gain element using a LC oscillator frequency as an input. The PLL tuning system may compare 504 a divided down oscillator frequency to the reference frequency input at the PLL phase detector. The PLL tuning system may then generate 506 a control signal based on the phase difference between the LC oscillator frequency and the reference frequency. A fractional divider in the PLL tuning system may receive the oscillator frequency. The fractional divider may use division ratios to produce the feedback signal. The feedback signal may then be sent to the phase detector in the PLL tuning system. The phase detector may alter 508 the LC oscillator frequency based on the control signal by comparing the LC oscillator frequency to the reference frequency and producing a voltage representing phase difference of the control signal and the reference frequency.

The PLL tuning system may continue to generate 502 the oscillator frequency, compare 504 the divided down oscillator frequency, generate 506 the control signal, and alter 508 LC oscillator frequency until the displacement of the piezoelectric tuning element produces an air gap between the capacitive disk and the piezoelectric tuning element resulting in the desired center frequency of the cavity filter. By this method, a cavity filter may be dynamically and electronically tuned.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An apparatus for tuning a cavity filter comprising:
   a membrane assembly comprising a piezoelectric tuning element configured to form a portion of the cavity filter; and
   a phase-locked loop circuit comprising:
      a phase-locked loop control system connected to the piezoelectric tuning element;
      a VCO gain element connected to the phase-locked loop control system; and
      a LC resonator connected to the VCO gain element, the LC resonator comprising:
         a tank coil, connected to the VCO gain element; and
         a capacitive disk connected to the tank coil,
   wherein:
      the VCO gain element, tank coil, capacitive disk and the piezoelectric tuning element form a resonator capacitor,
      the phase-locked loop control system is configured to apply a control signal to the piezoelectric tuning element,
      the LC resonator is configured to generate an oscillating signal in the VCO gain element, and
      the phase-locked loop circuit is configured to lock based on a phase difference between the reference signal and the oscillating signal.

2. The apparatus of claim 1, wherein the phase-locked loop control system is further configured to alter the control signal based on the phase difference.

3. The apparatus of claim 1, wherein the phase-locked loop control system comprises:
   a phase detector, wherein the phase-locked loop control system is connected to the piezoelectric tuning element through the phase detector;
   a fractional divider connected to the phase detector, wherein the VCO gain element is connected to the phase-locked loop control system through the fractional divider; and
   a modulator connected to the fractional divider,
   wherein the fractional divider is configured to receive the oscillating signal and produce an output frequency.

4. The apparatus of claim 3, wherein the fractional divider is configured to operate with a plurality of division ratios.

5. The apparatus of claim 3, wherein the phase detector is configured to receive a reference frequency.

6. The apparatus of claim 5, wherein the control signal represents a phase difference between the reference frequency and the output frequency.

7. An apparatus for tuning a plurality of cavity filters comprising:
- a membrane assembly comprising a plurality of piezoelectric tuning elements, each piezoelectric tuning element configured to form a portion of one of the plurality of cavity filters; and
- a plurality of phase-locked loop circuits, each phase-locked loop circuit comprising:
    - a phase-locked loop control system connected to one of the plurality of piezoelectric tuning elements;
    - a VCO gain element connected to the phase-locked loop control system;
    - a LC resonator connected to the VCO gain element; and
    - a capacitive disk connected to the LC resonator, wherein:
- each capacitive disk and piezoelectric tuning element comprise a resonator capacitor;
- each phase-locked loop control system is configured to apply a control signal to the one of the piezoelectric tuning elements,
- each LC resonator is configured to generate an oscillating signal in the VCO gain element,
- each phase detector element is configured to measure a phase difference between a reference signal and the oscillating signal, and
- each of the plurality of phase-locked loop circuits is configured to operate independently of each of the other of the plurality of phase-locked loop circuits.

8. The apparatus of claim 7, wherein each phase-locked loop control system is further configured to alter the control signal based on the oscillator signal.

9. The apparatus of claim 7, wherein each phase-locked loop control system comprises:
- a phase detector, wherein the phase-locked loop control system is connected to the one of the plurality of piezoelectric tuning elements through the phase detector;
- a fractional divider connected to the phase detector, wherein the VCO gain element is connected to the phase-locked loop control system through the fractional divider; and
- a modulator connected to the fractional divider,
wherein the fractional divider is configured to receive the oscillator signal and produce an output frequency.

10. The apparatus of claim 9, wherein each fractional divider is configured to operate with a plurality of division ratios.

11. The apparatus of claim 9, wherein each phase detector is configured to receive one of one or more reference frequencies.

12. The apparatus of claim 11, wherein the control signal represents a phase difference between one or more reference frequencies and the output frequency.

13. The apparatus of claim 7, wherein each LC resonator comprises:
- a tank coil connected to the VCO gain element; and
- a capacitive disk connected to the tank coil,
wherein the capacitive disk, tank coil, VCO gain element and the one of the plurality of piezoelectric tuning elements form a LC oscillator.

14. A method of tuning a cavity filter comprising:
- applying a control voltage to a piezoelectric tuning element;
- generating an oscillator frequency in a voltage-controlled oscillator including the piezoelectric tuning element based on a piezoelectric effect of the piezoelectric tuning element;
- comparing a phase of an oscillator frequency with a phase of a reference frequency to produce a phase difference voltage
- generating a control signal based on the phase difference voltage; and
- altering the oscillator frequency based on control signal,
wherein applying the control voltage to a piezoelectric tuning element;
    - generating the oscillator frequency; comparing a phase of an oscillator frequency with a phase of a reference frequency;
    - generating the control signal; and altering the oscillator frequency constitute a feedback loop to tune the cavity filter to a desired center frequency.

15. The method of claim 14, further comprising altering the oscillator frequency with a fractional divider.

16. The method of claim 14, wherein the voltage-controlled oscillator comprises a VCO gain element and LC resonator comprising a tank coil connected to a capacitive disk, and the piezoelectric tuning element, such that the capacitive disk and piezoelectric tuning element comprise a resonator capacitor.

17. The method of claim 14, wherein generating the oscillator frequency based on the piezoelectric effect of the piezoelectric tuning element is performed by a VCO gain element connected to the LC resonator.

18. The method of claim 14, wherein altering the oscillator frequency based on the control signal is performed by applying the control signal to the piezoelectric tuning element to alter a displacement of the piezoelectric tuning element through a piezoelectric effect.

* * * * *